United States Patent
Hao et al.

(10) Patent No.: US 10,854,933 B2
(45) Date of Patent: Dec. 1, 2020

(54) BATTERY PACK VOLTAGE-SWITCHING SYSTEMS AND CONTROL LOGIC FOR MULTI-PACK ELECTRIC-DRIVE MOTOR VEHICLES

(71) Applicant: GM Global Technology Operations LLC, Detroit, MI (US)

(72) Inventors: Lei Hao, Troy, MI (US); Yue-Yun Wang, Troy, MI (US); Chandra S. Namuduri, Troy, MI (US); Suresh Gopalakrishnan, Troy, MI (US); Thomas W. Nehl, Shelby Township, MI (US); Dongxu Li, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 146 days.

(21) Appl. No.: 16/251,766

(22) Filed: Jan. 18, 2019

(65) Prior Publication Data

US 2020/0235440 A1 Jul. 23, 2020

(51) Int. Cl.
| | | |
|---|---|---|
| *H02J 7/00* | (2006.01) | |
| *H01M 10/44* | (2006.01) | |
| *G01R 19/165* | (2006.01) | |
| *H01M 10/42* | (2006.01) | |
| *H01M 10/48* | (2006.01) | |

(52) U.S. Cl.
CPC .... *H01M 10/441* (2013.01); *G01R 19/16542* (2013.01); *H01M 10/425* (2013.01); *H01M 10/482* (2013.01); *B60W 2510/081* (2013.01); *H01M 2010/4271* (2013.01)

(58) Field of Classification Search
CPC ............. H01M 10/441; H01M 10/425; H01M 10/482; H01M 2010/4271; G01R 19/16542; B60W 2510/081
USPC .............................................. 320/109; 701/22
See application file for complete search history.

(56) References Cited

U.S. PATENT DOCUMENTS

| | | | |
|---|---|---|---|
| 6,275,004 | B1 | 8/2001 | Tamai et al. |
| 8,565,949 | B2 | 10/2013 | Christman et al. |
| 9,142,980 | B2 | 9/2015 | Lee |
| 9,660,462 | B2 | 5/2017 | Jeon |
| 2008/0284385 | A1 | 11/2008 | Namuduri et al. |
| 2011/0215767 | A1 | 9/2011 | Johnson et al. |
| 2011/0248675 | A1 | 10/2011 | Shiu et al. |

(Continued)

*Primary Examiner* — Zixuan Zhou
(74) *Attorney, Agent, or Firm* — Quinn IP Law

(57) ABSTRACT

Presented are battery pack voltage-switching ("V-switch") systems, methods for making/operating such systems, and multi-pack, electric-drive motor vehicles with battery pack V-switch capabilities. A method for controlling operation of a vehicle includes a vehicle controller receiving a voltage switch signal to change a voltage output of the vehicle's battery system. The vehicle controller determines if a speed of a traction motor is less than a calibrated base speed; if so, the controller transmits a pack isolation signal to a power inverter to electrically disconnect the traction battery packs from the traction motor. The vehicle controller determines if a bus current of a DC bus is less than a calibrated bus current threshold; if so, the controller transmits an open signal to open one or more pack contactor switches and a close signal to close one or more pack contactor switches thereby causing the vehicle battery system to output the second voltage.

20 Claims, 3 Drawing Sheets

(56) References Cited

U.S. PATENT DOCUMENTS

| | | |
|---|---|---|
| 2012/0181854 A1 | 7/2012 | Gopalakrishnan et al. |
| 2012/0206296 A1 | 8/2012 | Wan |
| 2013/0119935 A1 | 5/2013 | Sufrin-Disler et al. |
| 2013/0127399 A1 | 5/2013 | Tang et al. |
| 2014/0062349 A1* | 3/2014 | Isayeva .................. B60K 6/445 318/139 |
| 2014/0152232 A1 | 6/2014 | Johnson et al. |
| 2015/0112522 A1* | 4/2015 | Liang ........................ B60L 1/02 701/22 |

* cited by examiner

BATTERY PACK VOLTAGE-SWITCHING SYSTEMS AND CONTROL LOGIC FOR MULTI-PACK ELECTRIC-DRIVE MOTOR VEHICLES

INTRODUCTION

The present disclosure relates generally to hybrid and electric ("electric-drive") motor vehicles. More specifically, aspects of this disclosure relate to battery pack voltage-switching ("V-switch") protocols for multi-pack, electric-drive vehicles.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving power through a manually or automatically shifted multi-speed transmission to the vehicle's final drive system (e.g., differential, axle shafts, road wheels, etc.). Automobiles have historically been powered by a reciprocating-piston type internal combustion engine (ICE) assembly due to its ready availability and relatively inexpensive cost, light weight, and overall efficiency. Such engines include two and four-stroke compression-ignited (CI) diesel engines, four-stroke spark-ignited (SI) gasoline engines, six-stroke architectures, and rotary engines, as some non-limiting examples. Hybrid and full electric vehicles, on the other hand, utilize alternative power sources to propel the vehicle and, thus, minimize or eliminate reliance on a fossil-fuel based engine for tractive power.

A full electric vehicle (FEV)—colloquially referred to as an "electric car"—is a type of electric-drive vehicle configuration that altogether removes the internal combustion engine and attendant peripheral components from the powertrain system, relying solely on electric traction motors for propulsion and for supporting accessory loads. The engine, fuel system, and exhaust system of an ICE-based vehicle are replaced with an electric motor, a tractive battery back, and battery cooling and charging electronics in an FEV. Hybrid vehicle powertrains, in contrast, employ multiple sources of tractive power to propel the vehicle, most commonly operating an internal combustion engine assembly in conjunction with a battery-powered or fuel-cell-powered electric motor. A hybrid electric vehicle (HEV), for example, is generally equipped with an ICE assembly and an electric machine (E-machine), often in the form of a motor/generator unit (MGU), that operate individually or cooperatively to generate tractive power. Since hybrid vehicles are able to derive their power from sources other than the engine, engines in HEVs may be turned off, in whole or in part, while the vehicle is propelled by the electric motor(s).

While innumerable options are available, there are three primary types of hybrid powertrain architectures used in modern vehicles: series hybrid, parallel hybrid, and series-parallel ("power-split") hybrid configurations. Series hybrid architectures, for example, derive all tractive power from electric motors and, thus, eliminate any driving mechanical connection between the engine and final drive members. In this case, the engine functions solely as a regenerative energy source, driving an electric generator that charges the vehicle's onboard traction battery pack(s). For parallel hybrid architectures, the engine and each motor/generator unit has a driving mechanical connection to the power transmission and, thus, the vehicle's road wheels. As the name implies, series-parallel hybrid architectures combine features from both parallel hybrid and series hybrid powertrains. With gas-only, electric-only, and motor-assist operating modes, the motor and engine work independently or jointly—in parallel or in series—depending on the desired vehicle speed, overall vehicle power demand, and state-of-charge (SOC) of the battery pack(s).

Most commercially available hybrid and electric vehicles employ a rechargeable traction battery pack (electric-vehicle battery (EVB)) to store and supply the requisite power for operating the powertrain's motor/generator unit(s). A traction battery pack, which is significantly larger, more powerful, and higher in capacity than a 12-volt starting, lighting, and ignition (SLI) battery, is generally composed of a large stack of battery cells grouped into multiple battery modules that are mounted to the vehicle chassis via a battery housing or support tray. Some vehicle battery systems employ multiple independently-operable, high-voltage battery packs to provide higher voltage delivery and greater system capacity through increased amp-hours. A dedicated Battery Pack Control Module (BPCM) regulates the opening and closing of battery pack contactors to govern which pack or packs will power the vehicle's traction motor(s) at a given time. While the vehicle is in operation, the battery system may switch from one pack to another in a manner that protects the battery packs and contactors while ensuring a constant feed of voltage so as to not interfere with powertrain functionality.

SUMMARY

Disclosed herein are battery pack voltage-switching ("V-switch") systems with attendant control logic for multi-pack, electric-drive vehicles, methods for making and methods for operating such systems, and multi-pack, electric-drive motor vehicles with battery pack V-switch capabilities. By way of example, there are presented pack-to-pack voltage-switching control algorithms, methods of performing dynamic V-switch during constant motor torque range, and protocols for identifying a status of each electrical switch to ensure secure and reliable V-switch while the vehicle's drive system is in operation. Also presented are direct current (DC) bus voltage balancing protocols for charging/discharging a bus capacitor during V-switch, as well as switch control algorithms for operating the vehicle battery system under fault conditions when a switch fails. In an example, V-switch occurs during a constant torque range, e.g., when a real-time speed of a traction motor deviates from a vehicle-calibrated base motor speed. If e-machine speed is above or below this threshold, all inverter switches are turned off to decouple both battery packs from the drive system. Turning off all of the inverter switches may result in zero e-machine current and zero e-machine torque, and may concomitantly block battery current flow to/from the e-machine. This feature decouples and isolates both traction battery packs from the inverter and drive system under predetermined powertrain operating conditions.

Attendant benefits for at least some disclosed concepts include an electric-drive battery system architecture and pack V-switch protocol that enable secure and reliable management of two or more traction battery packs during powertrain operation. For heavy electric-drive vehicles (e.g., gross vehicle weight (GVW) of at least 7,000 lbs.), multiple battery packs may be used to achieve a platform-designated electric range while complying with manufacturing tolerances and assembly constraints. Variable voltage pack-to-pack switching, e.g., to double or halve battery system voltage output, may improve electrical motor efficiency and increase propulsion power at high-speed operation. Additional benefits may include the ability to isolate the battery packs from the power inverter and drive system during V-switch to minimize energy exchange for secure and reliable operation. Disclosed V-switch techniques may also incorporate a system-fault control strategy if there is a switch failure. Disclosed pack V-switch protocols may also help to improve battery system efficiency and prolong battery pack operational life expectancy.

Aspects of this disclosure are directed to pack-to-pack voltage-switching control logic, software algorithms, and computer readable media for multi-pack, electric-drive vehicles. In an example, a method is presented for controlling operation of a motor vehicle. The motor vehicle includes multiple road wheels and an electric machine (e.g., one or more motor/generator units) that is operable to drive the wheels to thereby propel the vehicle. Two or more onboard traction battery packs individually and/or collectively power the electric machine. A vehicle controller, which may be in the nature of a Transmission Power Inverter Module (TPIM), a Battery Pack Control Module (BPCM), and/or a Hybrid Control Module (HCP), controls the electric machine and battery packs. For hybrid-type electric-drive architectures, the vehicle is also equipped with an internal combustion engine.

The foregoing representative method includes, in any order and in any combination with any of the above and below options and features: receiving, via the vehicle controller, a voltage switch signal to change a battery system output voltage from a first voltage to a second voltage; determining, via the vehicle controller, if a machine speed of the electric machine is less than a calibrated base machine speed; transmitting, via the vehicle controller to a power inverter responsive to the machine speed being less than the calibrated base machine speed, a pack isolation signal to open multiple inverter switches thereby electrically disconnecting the first and second traction battery packs from the electric machine; determining, via the vehicle controller, if a bus current of a direct current (DC) bus electrically connecting the first and second traction battery packs to the power inverter is less than a calibrated bus current threshold; and transmitting, via the vehicle controller to a set of pack contactor switches responsive to the bus current being less than the calibrated bus current threshold, an open signal to open one of the pack contactor switches and a close signal to close another of the pack contactor switches thereby causing the first and/or second traction battery packs to output the second voltage.

Other aspects of the disclosure are directed to multi-pack, electric-drive motor vehicles with pack-to-pack V-switch capabilities. As used herein, the term "motor vehicle" may include any relevant vehicle platform, such as passenger vehicles (HEV, PHEV, FEV, BEV, REEV, etc.), commercial vehicles, industrial vehicles, tracked vehicles, off-road and all-terrain vehicles (ATV), motorcycles, farm equipment, boats, planes, etc. In an example, an electric-drive motor vehicle includes a vehicle body with multiple road wheels and, optionally, in internal combustion engine assembly. One or more electric traction motors are mounted onto the vehicle body and operate individually (e.g., in a full-electric vehicle (FEV) application) or in conjunction with an internal combustion engine (e.g., in a hybrid-electric vehicle (HEV) application) to drive one or more of the vehicle wheels to thereby propel the vehicle. A pair of traction battery packs is mounted onto the vehicle body and operable to power the traction motor(s).

The electric-drive motor vehicle in the above example also includes a resident or remote vehicle controller or a network of controllers or modules that is communicatively connected to the traction motor(s) and battery packs. The vehicle controller is programmed to receive a voltage switch signal to change an output voltage of the battery system from a low (or high) voltage to a high (or low) voltage. Upon receiving the request, the vehicle controller responsively determines if an e-machine speed of each traction motor is less than a calibrated base e-machine speed; if so, the controller automatically transmits a pack isolation signal to a power inverter to open multiple inverter switches thereby causing the traction battery packs to electrically disconnect from the traction motor(s). The vehicle controller then determines if a real-time bus current of a DC bus, which electrically connects the traction battery packs to the power inverter, is less than a calibrated bus current threshold; if so, the controller responsively transmits: (1) an open signal to open one or more switches in a set of pack contactor switches, and (2) a close signal to close one or more of the pack contactor switches. In so doing, the battery system outputs the requested low/high voltage.

For any of the disclosed vehicles, methods, and systems, the set of pack contactor switches includes first, second, and third switches: opening the third switch and thereafter closing the first and second switches will electrically connect the traction battery packs in parallel; conversely, opening the first and second switches and thereafter closing the third switch will electrically connect the traction battery packs in series. If the first voltage is greater than the second voltage (e.g., switching from 800V to 400V), the vehicle controller first opens the third switch, and then closes the first and second switches. On the other hand, if the first voltage is less than the second voltage (e.g., switching from 400V to 800V), the vehicle controller first opens the first and second switches, and then closes the third switch.

For any of the disclosed vehicles, methods, and systems, the vehicle controller may determine, prior to transmitting the close signal, if a capacitor voltage of a bus capacitor of the DC bus is less than (or greater than) a calibrated capacitor voltage threshold. For a high-to-low V-switch request, the vehicle controller transmits the close signal to close the first and second switches responsive to the capacitor voltage being less than the calibrated capacitor voltage threshold. By comparison, for a low-to-high V-switch request, the vehicle controller transmits the close signal to close the third switch responsive to the capacitor voltage being greater than the calibrated capacitor voltage threshold.

For any of the disclosed vehicles, methods, and systems, the vehicle controller may also determine, prior to transmitting the close signal, if respective battery pack currents of the traction battery packs are each less than a calibrated pack current threshold. Responsive to a determination that all battery pack currents are less than the calibrated pack current threshold, the vehicle controller transmits a pulse-width modulation (PWM) signal to the set of pack contactor switches to modulate respective pulse widths of the switch or switches being closed. After closing the corresponding switches, the vehicle controller may transmit another PWM signal to the power inverter to modulate pulse widths of the inverter switches to thereby invert a DC voltage output by the first and/or second traction battery packs into an alternating current (AC) voltage received via the one or more traction motors.

For any of the disclosed vehicles, methods, and systems, the vehicle controller may measure, using one or more current sensors, respective charge currents of the first and second traction battery packs. The vehicle controller, after opening the third switch (or first and second switches) and closing the first and second switches (or third switch), may determine if the battery pack charge currents are both less than a calibrated charge current threshold. If so, the vehicle controller balances a bus voltage of the DC bus by charging (or discharging) the DC bus capacitor from (to) the traction battery packs.

For any of the disclosed vehicles, methods, and systems, the vehicle controller may transmit another open signal to open the previously-closed first and second switches (or third switch) after opening the third switch (or first and second switches). When all three switches have been opened, the vehicle controller may determine if respective electrical currents of the traction battery packs are approximately equal to zero. If so, the vehicle controller may automatically respond by displaying and/or storing a switch state indicator indicative of the third switch (or first and second switches) being in an open state.

The above summary is not intended to represent every embodiment or every aspect of the present disclosure. Rather, the foregoing summary merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes any and all combinations and subcombinations of the elements and features presented above and below.

Figure 1:
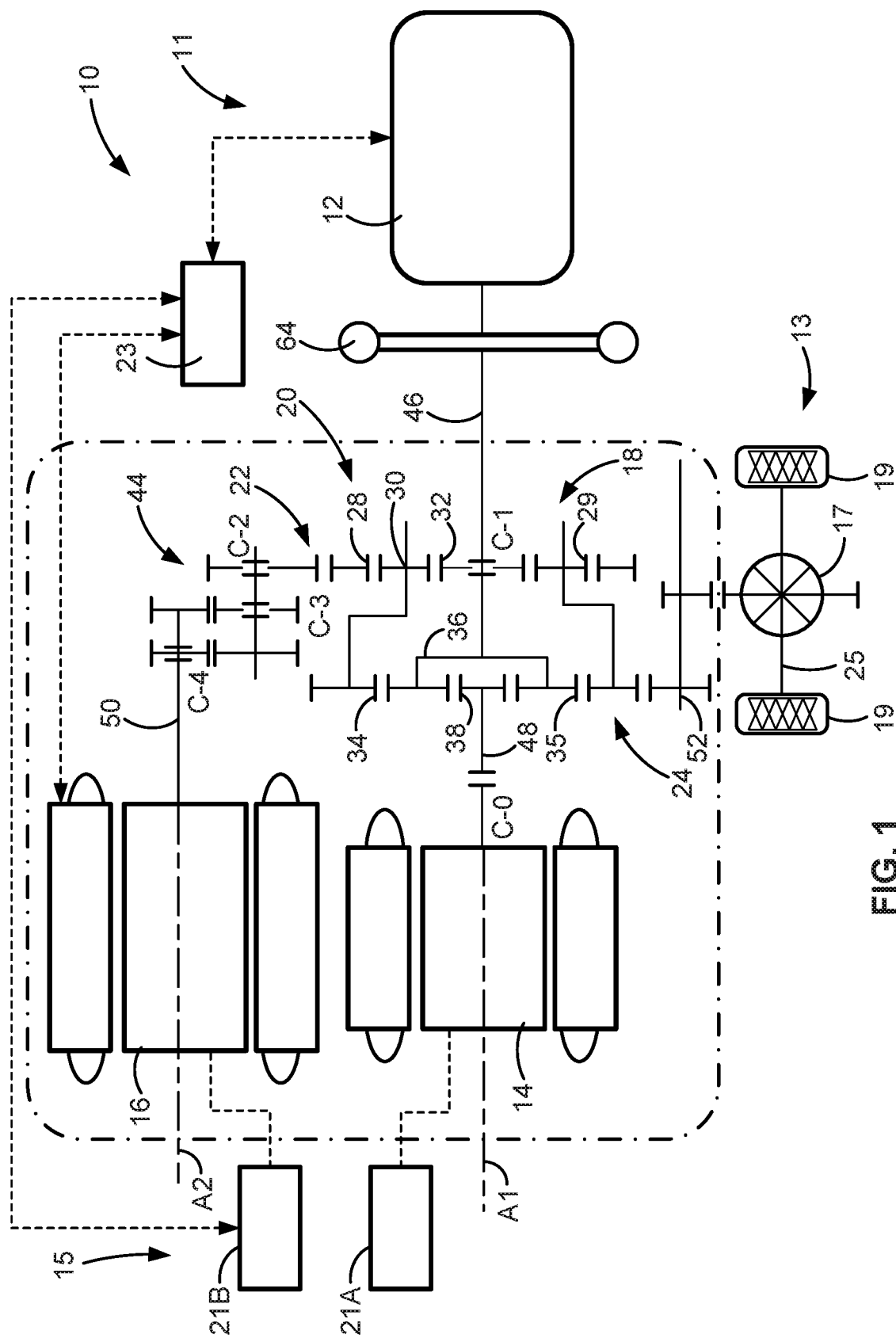
FIG. 1 is a schematic diagram illustrating a representative power-split hybrid powertrain architecture of a multi-pack, electric-drive motor vehicle with pack-to-pack voltage-switching capabilities in accordance with aspects of the present disclosure.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "approximately," and the like, may be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle when the vehicle is operatively oriented on a normal driving surface.

Referring now to the drawings, wherein like reference numbers refer to like features throughout the several views, there is shown in FIG. 1 a schematic illustration of a representative automobile, which is designated generally at 10 and portrayed herein for purposes of discussion as a hybrid electric passenger vehicle. In accord with a more specific, non-limiting example, the powertrain 11 is a dual-mode, power-split hybrid electric powertrain with a variable-displacement 6.0-liter (L) V8 engine 12 and two 60-kilowatt (kW) multiphase brushless permanent magnet (PM) motors 14 and 16 that are mounted to a multi-speed electrically variable transmission (EVT) 18. The illustrated automobile 10—also referred to herein as "motor vehicle" or "vehicle" for short—is merely an exemplary application with which novel aspects and features of this disclosure can be practiced. In the same vein, implementation of the present concepts into a dual-mode, power-split hybrid electric powertrain should also be appreciated as an exemplary application of the novel concepts disclosed herein. As such, it will be understood that aspects and features of the disclosure can be applied to other electric-drive powertrain configurations and utilized for any logically relevant type of motor vehicle. Lastly, only select components have been shown and will be described in additional detail herein. Nevertheless, the vehicles and battery systems discussed below can include numerous additional and alternative features, and other commercially available peripheral components, e.g., for carrying out the various methods and functions of this disclosure.

The hybrid powertrain 11 of FIG. 1 may be designed to launch and propel the vehicle 10, to operate the vehicle in all speed ranges between low and high road speeds, and to power any or all of the onboard vehicle electronics. An "electrically variable transmission," as shown in the drawings, comprises a transmission planetary gear train operatively connected to each of the engine 12, the first motor/generator unit (MGU) 14, and the second MGU 16. Channeling respective torques of the engine 12 and the two motor/generator units 14, 16 (referred to interchangeably as "traction motors") to different members of the planetary gear train permits one of the power sources to either assist or balance the operation of any of the other two power sources. Thus, the combination of an engine 12 and multiple motor/generator units 14, 16 operatively connected to the EVT 18 allows speeds and torques of the engine and motor/generators to be controlled and selected independently in order to power a subject vehicle 10 more efficiently.

The vehicle 10 is equipped with a vehicle battery system 15 that may comprise, for example, multiple battery cells arranged as battery modules that are stacked into multiple traction battery packs 21A and 21B. These battery cells may utilize any suitable battery technology, including, for example, lead-acid, nickel-metal hydride (NiMH), lithium-ion ("Li-Ion"), Li-Ion polymer, zinc-air, lithium-air, nickel-cadmium (NiCad), valve-regulated lead-acid ("VRLA"), including absorbed glass mat ("AGM"), nickel-zinc (NiZn), molten salt (e.g., a Na—NiCl$_2$ battery), or any combination thereof. Each battery pack or each battery cell may be associated with one or more sensors to measure one or more battery characteristics (e.g., voltage, current, temperature, SOC, capacity, etc.) associated with each pack/cell. The vehicle battery system 15 is operatively connected to the first and second motor/generators units 14, 16 to transfer electrical current to and receive electrical current from these MGUs. Resident vehicle controller 23 is communicatively connected to the engine 12, traction motors 14, 16, vehicle battery system 15, and transmission 18 to control the operation thereof. Controller, control module, module, control unit, processor, and any permutations thereof may be defined to mean any one or various combinations of one or more of logic circuits, Application Specific Integrated Circuit(s) (ASIC), electronic circuit(s), central processing unit(s) (e.g., microprocessor(s)), and associated memory and storage (e.g., read only, programmable read only, random access, hard drive, tangible, etc.)), combinational logic circuit(s), input/output circuit(s) and devices, etc., whether resident, remote, or a combination of both.

Vehicle controller 23 may be integrated circuit (IC) hardware programmed to execute one or more software or firmware programs or routines, e.g., using appropriate signal conditioning and buffer circuitry, and other components to provide the described functionality. Software, firmware, programs, instructions, routines, code, algorithms and similar terms may be defined to mean any controller-executable instruction sets, including calibrations and look-up tables. A controller may be designed with a set of control routines executed to provide one or more desired functions. Control routines are executed, such as by a central processing unit, and are operable to monitor inputs from sensing devices and other networked control modules, and execute control and diagnostic routines to control operation of devices and actuators. Routines may be executed in real-time, continuously, systematically, sporadically and/or at regular intervals, for example, each 100 microseconds, 3.125, 6.25, 12.5, 25 and 100 milliseconds, etc., during ongoing vehicle use. Alternatively, routines may be executed in response to occurrence of an event during operation of the vehicle 10.

Selectively operable as a continuously variable power transmission, EVT 18 of FIG. 1 includes multiple gear trains, such as a first planetary gear set (PGS) 22, a second PGS 24, and a gear train 44, and helps to define a compound-power-split hybrid powertrain 11 architecture by incorporating a compound planetary gear arrangement 20. This compound planetary gear arrangement 20 is composed of two members of the first PGS 22 being operatively connected to two members of the second PGS 24. First PGS 22 is composed of a ring gear member 28, a planet carrier member 30, and a sun gear member 32. One or more planet gears 29 is/are intermeshed with the ring gear 28 and mounted on the planet carrier member 30, while the sun gear member 32 is intermeshed with the planet gear(s) 29 and concentrically aligned with the ring gear 28. In this regard, the second PGS 24 includes a ring gear member 34, a planet carrier member 36, and a sun gear member 38. One or more planet gears 35 is/are intermeshed with the ring gear 34 and mounted on the planet carrier member 36, while the sun gear member 38 is intermeshed with the planet gear(s) 35 and concentrically aligned with the ring gear 34. The carrier member 36 of the second gear set 24 is interconnected with the sun gear member 32 of the first gear set 22, e.g., to rotate in unison therewith. The ring gear member 34 of the second gear set 24 is interconnected with the carrier member 30 of the first gear set 22 e.g., to rotate in unison therewith. Finally, the ring gear member 28 of the first gear set 22 is shown interconnected with a transfer gear train 44. The junction points of the EVT 18 are represented by selectable and fixed interconnections such that the resultant structure effectively generates a multi junction point lever when selectable torque transmitting-devices C-0, C-1, C-2, C-3 and C-4 are engaged and disengaged individually and in select combinations.

As portrayed in FIG. 1, the engine 12 and the first motor/generator unit 14, or at least the respective torque-transmitting output shafts thereof, may be disposed for rotation on a common first rotating axis A1. Conversely, the second motor/generator unit 16, or at least the torque-transmitting output shaft thereof, may be disposed for rotation on a second rotating axis A2. According to the illustrated example, the first axis A1 is substantially parallel to the second axis A2. The gear-train 44 of FIG. 1 is configured to operatively connect the second motor/generator unit 16 to the compound planetary gear arrangement 20 at a corresponding junction point. The gear-train 44 may be configured as either a single-stage or a two-stage parallel shaft gear set or as a third PGS.

Engine 12, first MGU 14, and second MGU 16 are operatively connected to the EVT 18 via input member arrangements that transmit torque between the tractive power sources and the compound planetary gear arrangement 20. By way of non-limiting example, the input member arrangement includes: an engine output shaft of the engine 12, which serves as an engine input/output member 46; a rotor of the first MGU 14, which serves as a first motor input/output member 48; and a rotor of the second MGU 16, which serves as a second motor input/output member 50. The engine input/output member 46 provides engine torque to the EVT 18, whereas motor input/output members 48, 50 provide torque from their respective motor/generator units 14, 16 to the EVT 18. A damper assembly 64, which is operatively connected to the input/output shaft 46 of the engine 12, is configured to absorb torsional vibrations generated by the engine 12 before such vibrations can be transmitted to the planetary gear arrangement 20 of EVT 18.

It may be desirable for the first motor input member 48 to be continuously connected or selectively connectable (e.g., via torque transmitting device C-0) to the sun gear member 38. Second motor input member 50 may be continuously connected or selectively connectable (e.g., via torque transmitting device C-4) to the gear train 44. The EVT 18 also includes an output member 52, which may be in the nature of a transmission output shaft, that is continuously connected or selectively connectable to a third junction point. In order to launch and propel the vehicle 10, output member 52 is operable to transmit torque from the compound planetary gear arrangement 20 to a final drive system 13, which is represented herein by differential 17, drive wheels 19 and axle 25. Regenerative braking may be achieved by transferring torque from the final drive system 13, through the output member 52 and EVT 18, to the MGUs 14, 16 when operating in an electric generator mode.

The ICE assembly 12 operates to propel the vehicle 10 independently of the traction motors 14 and 16, e.g., in an "engine-only" operating mode, or in cooperation with either or both motors 14 and 16, e.g., in a "motor-boost" and/or a "motor-launch" operating mode. In the example depicted in FIG. 1, the ICE assembly 12 may be any available or hereafter developed engine, such as a two or four-stroke compression-ignited diesel engine or a four-stroke spark-ignited gasoline or flex-fuel engine, which is readily adapted to provide its available power output typically at a number of revolutions per minute (RPM). Although not explicitly portrayed in FIG. 1, it should be appreciated that the final drive system 13 may take on any available configuration, including front wheel drive (FWD) layouts, rear wheel drive (RWD) layouts, four-wheel drive (4WD) layouts, all-wheel drive (AWD) layouts, etc.

Figure 2:
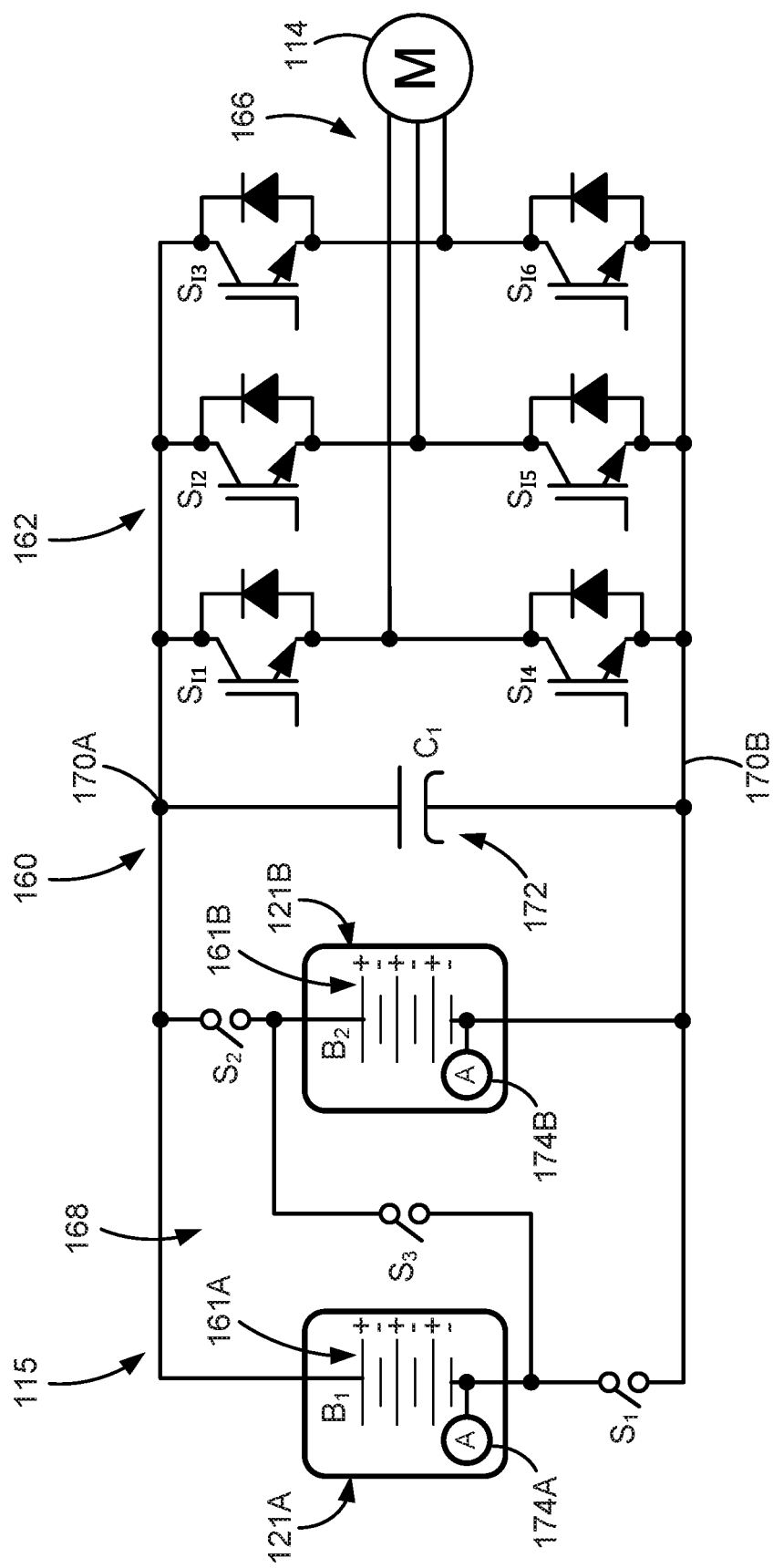
FIG. 2 is a schematic diagram illustrating a representative electric-drive vehicle battery system with multiple traction battery packs in accordance with aspects of the present disclosure.

Turning next to FIG. 2, there is shown an onboard rechargeable energy storage system (RESS) 115 that is adapted for storing high-voltage electrical energy used for propelling an electric-drive vehicle, such as hybrid electric vehicle 10 of FIG. 1. RESS 115 may be a deep-cycle, high-ampere capacity battery system rated for approximately 400 to 800 VDC or more, for example, depending on a desired vehicle range, gross vehicle weight, and power ratings of the various loads drawing electrical power from the RESS 115. To this end, the RESS 115 may include multiple high-voltage, independently-rechargeable battery packs 121A and 121B that are selectively electrically connectable to one or more polyphase electric machines, such as three-phase traction motor 114. While only two traction battery packs 121A, 121B and one traction motor 114 are shown in FIG. 2 for illustrative simplicity, three or more battery packs may be used within RESS 115 to power multiple traction motors.

The first (B1) and second (B2) traction battery packs 121A, 121B may be connected in electrical parallel with respect to a high-voltage DC bus bar 160 and a power inverter 162 for governing the transmission of electrical energy to and from the traction motor 114. Each pack 121A, 121B comes equipped with a respective stack 162A and 162B of battery cells, including lithium ion cells, lithium polymer cells, or any other rechargeable electrochemical cells providing a sufficiently high-power density, as well as any requisite conductive battery support structure and current conditioning hardware. The number and arrangement of battery cells 162A, 162B in each pack 121A, 121B may vary with the intended application of the RESS 115, for instance with 96 or more such cells per pack used in certain high-voltage applications. Although differing in appearance, the RESS 115 of FIG. 2 may include any of the options and features described above with respect to the vehicle battery system 15 of FIG. 1, and vice versa.

A DC-to-AC and AC-to-DC power inverter 162, which may be part of a transmission power inverter module (TPIM), connects via polyphase windings 166 to traction motor 114 to transmit electrical energy between the motor 114 and battery packs 121A, 121B. The power inverter 162 may incorporate multiple power inverters and respective motor control modules operable to receive motor control commands and control inverter states therefrom for providing motor drive or regenerative functionality. The power inverter 162 may comprise a set 164 of semiconductor switches $S_{11}$-$S_{16}$ (also referred to herein as "inverter switches") that cooperatively convert direct current (DC) power from the energy storage devices—battery packs 121A, 121B—to alternating current (AC) power for powering the electric machine 114 via high-frequency switching. Each semiconductor switch $S_{11}$-$S_{16}$ may be embodied as a voltage-controlled bipolar switching device in the form of insulated gate bipolar transistor (IGBT), metal-oxide semiconductor field effect transistor (MOSFET), wideband GaN device (WBG), or other suitable switch having a corresponding gate to which a gate signal is applied to change the on/off state of a given switch. There is typically at least one semiconductor switch for each phase of a three-phase electric machine.

The traction battery packs 121A, 121B include a set 168 of solid-state relay switches or contactors S1-S3 (also referred to herein as "pack contactor switches") that are independently responsive to signals from a suitable controller or dedicated control module to govern the electrical output of the battery system 115. Contactors/switches S1-S3 are adapted to close under electrical load so as to ensure the instantaneous or near instantaneous delivery of electrical power to the vehicle's propulsion system and to drive any number of in-vehicle accessories. As with the semiconductor inverter switches 164 within the power inverter 162, pack contactor switches 168 may be constructed of highly efficient switching device, such as wide-gap gallium nitride (GaN) or silicon carbide (SiC) MOSFETs, IGBTs, or other suitable electronic devices. The first pack contactor switch S1 is in electrical series with the first traction battery pack 121A and in electrical parallel with the second traction battery pack 121B. In this regard, second pack contactor switch S2 is in electrical series with the second traction battery pack 121B and in electrical parallel with the first traction battery pack 121A. Conversely, third pack contactor switch S3 is in electrical series with both traction battery packs 121A, 121B. A direct-current battery output voltage is delivered across positive and negative voltage bus rails 170A and 170B, respectively, with a fixed-type DC bus capacitor 172 placed in electrical parallel with both traction battery packs 121A, 121B.

To help improve electrical efficiency of the motors and increase powertrain propulsion power at high-speed vehicle operation, battery pack V-switch systems and attendant control logic are presented for regulating voltage output of multiple traction battery packs in hybrid and electric motor vehicles. V-switch may be implemented during a constant torque range, e.g., when a real-time, measured e-machine (motor) speed is below a memory-stored, calibrated base machine (motor) speed. If machine speed is below this threshold by at least a predetermined high-speed offset value (HS), all pack-to-motor inverter switches may be turned off (i.e., opened) to decouple the battery packs from the drive system. Turning off these inverter switches may result in zero e-machine current and zero e-machine torque, while concomitantly blocking battery pack current flow to/from the e-machine. This feature decouples and isolates the battery packs from the inverter and drive system under predetermined powertrain operating conditions. For at least some embodiments, e-machine base speed is machine-specific, determined by bench testing and e-machine design. For a given e-machine, the base speed may be fixed for a given voltage, e.g., as the highest speed that the e-machine still produces full torque. For this application, the threshold may be set below the calibrated e-machine base speed to ensure reliable and secure system operation.

During electric-drive powertrain operation, bus voltage balancing may be implemented, for example, to stabilize a voltage across one or more neutral points of the power inverter. By way of example, and not limitation, opening all pack-to-motor inverter switches (e.g., before a V-switch event) operates to isolate the vehicle's e-drive system from the vehicle's battery system. During a high-voltage (e.g., 800V) to low-voltage (e.g., 400V) V-switch event, energy stored in one or more bus capacitors is selectively discharged into the battery system's traction battery packs. In the representative architecture presented in FIG. 2, this operation may be achieved by opening all six semiconductor inverter switches $S_{11}$-$S_{16}$, then opening the third pack contactor switch S3, and thereafter closing the first and second pack contactor switches S1, S2. In so doing, the battery packs 121A, 121B are disconnected from the power inverter 162 and motor 114 and placed in electrical parallel with the DC bus capacitor 172. During a low-voltage (e.g., 400V) to high-voltage (e.g., 800V) V-switch event (e.g., for DC fast charging), the capacitor may be pre-charged from the battery system (e.g., at an initial voltage of approximately 400V to 800V). In the representative architecture presented in FIG. 2, this operation may be achieved by opening all six semiconductor inverter switches $S_{11}$-$S_{16}$, then operating open the first and second pack contactor switches S1, S2, and thereafter operating closed the third pack contactor switch S3, e.g., in a linear range to keep the capacitor surge current within acceptable limits. In so doing, the battery packs 121A, 121B are disconnected from the power inverter 162 and motor 114 and placed in electrical series with the DC bus capacitor 172.

For bus voltage balancing, it may be desirable to first confirm that the resultant charge/discharge current is within a pack-calibrated acceptable limit or, optionally, to operate a closed pack contactor switch or switches in a predetermined linear range to govern the charge/discharge current. Respective real-time electrical currents of the traction battery pack 121A, 121B of FIG. 2, for example, may be measured using dedicated current sensors 174A and 174B, which may be integrated within a battery housing of a corresponding battery pack. The pack-calibrated acceptable limit may be set as a maximum battery pack charge/discharge current that is available from a corresponding battery spec. This maximum battery pack current may be set to mitigate overheating or overcharging the packs, and avoid welding shut any of the pack contactor switches, while maintaining an acceptable minimum charge time. In this instance, a vehicle controller may measure a respective total charge current for each pack; once measured, the RESS 115 evaluates whether each of these measured total charge currents is less than the battery-system calibrated charge current maximum.

Operating a pack contactor switch in a linear range to reduce charge/discharge current may include controlling an input to a solid-state switch at a level determined to keep that switch fully OFF (e.g., switch current <0.1 milliamps (mA)) or at a level to keep that switch fully ON (e.g., switch voltage drop <saturation voltage of 2V). A silicon IGBT, for example, may use a voltage of about 0V to −15V across its gate and emitter terminals to maintain a fully OFF state, and a voltage of between about 12V to 18V across its gate and emitter terminals to maintain a fully ON state. It may be possible to control the voltage across the gate and emitter terminals to a voltage above the threshold voltage (e.g., 5V) for the device to start conducting the charge/discharge current, but have a voltage drop that is approximately proportional to the current. Linear-mode operation of the device may therefore apply a voltage greater than a saturation voltage of the IGBT that is sustained while conducting a controlled amount of current by adjusting the voltage across the gate and emitter terminals, e.g., between 5V to 10V.

To help ensure secure and reliable V-switch operation, it may be necessary to identify a switch status of each pack contactor switch to help fail-safe contactor switch sequencing. Referring once again to the system architecture of FIG. 2, a high-voltage (e.g., 800V) to low-voltage (e.g., 400V) V-switch operation may include first opening the third pack contactor switch S3 and then closing the first and second pack contactor switches S1, S2. Switches S1 and S2 are subsequently opened such that all three switches S1-S3 are open; sensors 174A, 174B contemporaneously measure the electrical currents of the first and second traction battery packs 121A, 121B. If both measured currents reach zero, the vehicle battery system (RESS) 115 can confirm that switch S3 is in an open state. After that, switches S1 and S2 may be closed to determine if the pack currents change from zero to some value, e.g., during discharge of the DC bus capacitor 172. If they do, the vehicle battery system (RESS) 115 can confirm that switches S1 and S2 are in a closed state. During a low-voltage (e.g., 400V) to high-voltage (e.g., 800V) V-switch event, the first and second pack contactor switches S1, S2 are first opened and then the third pack contactor switch S3 is closed. Switch S3 is subsequently opened, such that all three switches are open; sensors 174A, 174B contemporaneously measure the electrical currents of the first and second traction battery packs 121A, 121B. If these measured currents reach zero, the vehicle battery system (RESS) 115 can confirm that switches S1 and S2 are in an open state. Afterwards, S3 is once again closed and the pack currents are measured to confirm that they change from zero to some value, e.g., to charge the DC bus capacitor 172. If they do, the vehicle battery system (RESS) 115 can confirm that switch S3 is closed.

During electric-drive powertrain operation, it may be desirable to implement a Switch Fault Operation protocol upon determination that one or more battery system switches have failed. Upon determining that the third pack contactor switch S3 cannot be opened during a high-to-low voltage V-switch, for example, vehicle battery system (RESS) 115 may default to maintaining the high-voltage (e.g., 800V) system configuration: S1=open; S2=open; S3=closed. In the same vein, upon determining that the first and second pack contactor switches S1 and/or S2 cannot be closed after switch S3 is opened during a high-to-low V-switch, vehicle battery system (RESS) 115 may default back to the high-voltage system configuration. Likewise, upon determining that the package voltage cannot be balanced due to a failed cell, vehicle battery system (RESS) 115 may automatically revert back to the high-voltage system configuration. Upon determining that the first and/or second pack contactor switches S1, S2 cannot be opened during a low-to-high voltage V-switch, vehicle battery system (RESS) 115 may automatically default to a low-voltage (e.g., 400V) system configuration: S1=closed; S2=closed; S3=open. Similarly, upon determining that pack contactor switch S3 cannot close after switches S1 and S2 are opened, RESS 115 may default back to the low-voltage system configuration.

Figure 3:
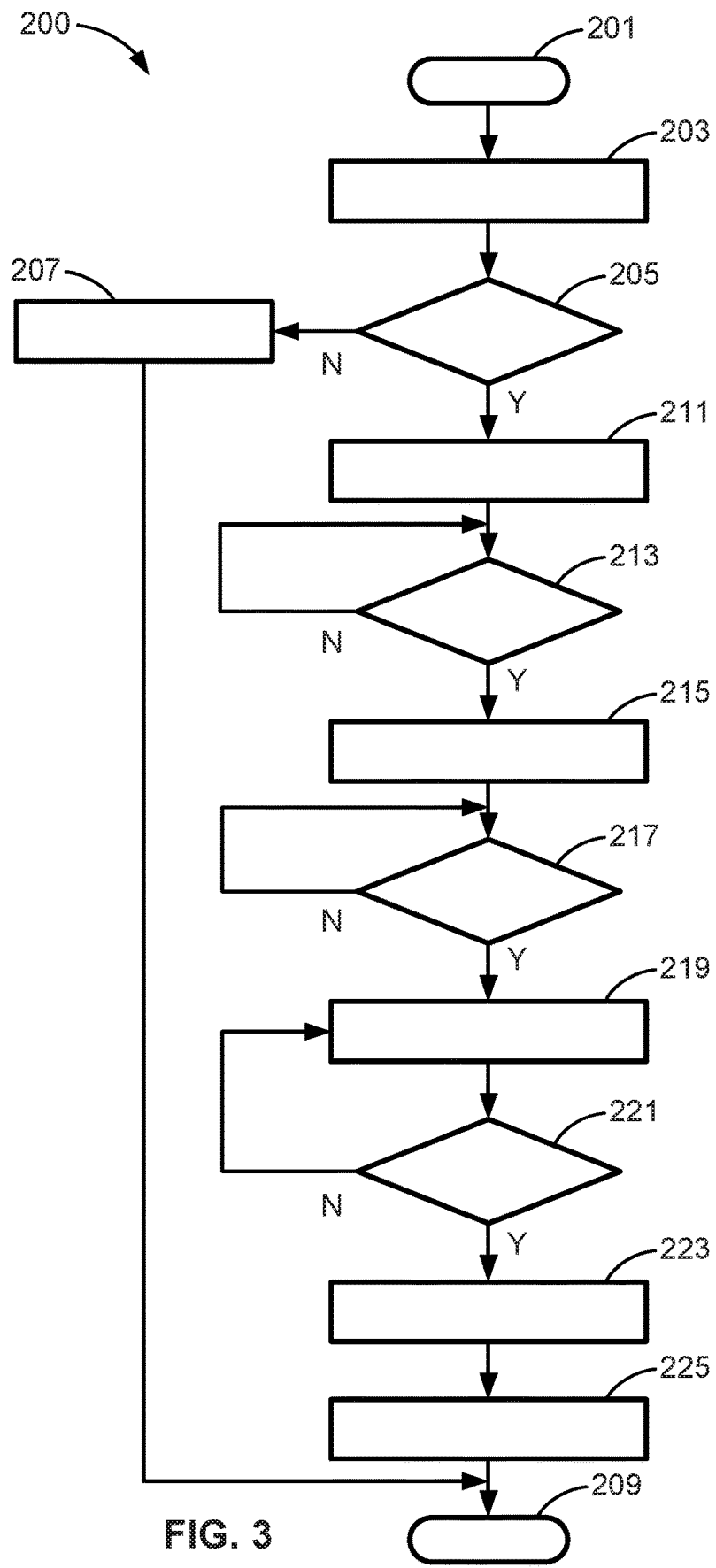
FIG. 3 is a flowchart illustrating a representative battery pack V-switch algorithm for governing operation of multiple traction battery packs of an electric-drive vehicle, which may correspond to memory-stored instructions executed by onboard or remote control-logic circuitry, programmable electronic control unit, or other computer-based device or network of devices in accord with aspects of the disclosed concepts.

With reference now to the flowchart of FIG. 3, an improved method or control strategy for governing voltage output of multiple traction battery packs, such as battery packs 21A, 21B of FIG. 1 or battery packs 121A, 121B of FIG. 2, of an electric-drive vehicle, such as automobile 10 of FIG. 1, is generally described at 200 in accordance with aspects of the present disclosure. Some or all of the operations illustrated in FIG. 3 and described in further detail below may be representative of an algorithm that corresponds to processor-executable instructions that may be stored, for example, in main or auxiliary or remote memory, and executed, for example, by an on-board or remote controller, processing unit, control logic circuit, or other module, device and/or network of devices, to perform any or all of the above or below described functions associated with the disclosed concepts. It should be recognized that the order of execution of the illustrated operation blocks may be changed, additional blocks may be added, and some of the blocks described may be modified, combined, or eliminated.

Method 200 begins at terminal block 201 of FIG. 3 with processor-executable instructions for a programmable controller or control module or similarly suitable processor to call up an initialization procedure for a real-time battery pack V-switch protocol that enables dynamic pack-to-pack voltage switching during drive system operation. While envisioned as complementary with pack-level, cell-to-cell switching techniques, the illustrated control method 200 may be intended for system-level, pack-to-pack voltage switching. This routine may be executed in real-time, continuously, systematically, sporadically, and/or at regular intervals during active vehicle operation. As yet another option, terminal block 201 may initialize responsive to a command prompt signal from a user or a broadcast prompt signal from a backend or middleware computing node tasked, for example, with collecting, analyzing, sorting, storing and distributing vehicle data. The control system may be operable to receive, process and synthesize pertinent information and inputs, and execute control logic and algorithms to regulate various powertrain components to achieve control targets. In this regard, vehicle controller 23 may be embodied as a distributed controller architecture composed of a TPIM, a Transmission Control Module (TCM), an Engine Control Module (ECM), and/or a Battery Pack Control Module (BPCM) with an integrated Hybrid Control Module (HCP) that offers hierarchical control and coordination of the aforementioned modules.

Following initialization of the battery pack V-switch protocol, method 200 provides processor-executable instructions at process block 203 for a vehicle controller or dedicated control module to receive a voltage switch request to change a total output voltage of a battery system from a first voltage to a second voltage (e.g., from 400V to 800V or from 800V to 400V). Through a suitable human-machine interface (HMI) operably connected to a network of in-vehicle devices, for example, a vehicle operator may direct operation of a powertrain through a request for a desired torque output with a resultant voltage adjustment to support any associated load changes. Exemplary vehicle HMI devices include an accelerator pedal, a brake pedal, a transmission gear selector, and a vehicle speed cruise control selector. Each of the aforementioned HMI devices communicates with remote and/or resident control modules, sensors, devices, and actuators via a local area network (LAN) bus. For controller-automated (autonomous) driving maneuvers, the voltage switch request may be transmitted via a powertrain control module (PCM) to the BPCM.

Responsive to the voltage switch request, the method 200 determines at decision block 205 if an e-machine speed (e.g., a rotational velocity of the first and/or second motor shafts 48, 50 of FIG. 1) is less than a machine-calibrated base machine speed by at least a predetermined high-speed offset value (HS) (e.g., approximately 1.5% or more). Each MGU 14, 16 may be equipped with various sensing devices for monitoring motor operation, including a shaft sensor (not shown) having an output indicative of rotational position, e.g., angle and/or speed (RPM). If either MGU 14, 16 is operating at a speed that is at or above the base machine speed (Block 205=NO), the method 200 of FIG. 3 moves to process block 207, deletes or otherwise disregards the voltage switch request, and thereafter proceeds to terminal block 209 and terminates or loops back to terminal block 201.

Upon determining that the e-machine speed is less than the calibrated base machine speed by at least the predetermined HS offset value (Block 205=YES), the battery system automatically electrically disconnects the traction battery packs from the vehicle's electric drive system at process block 211. According to the illustrated examples, resident vehicle controller 23 of FIG. 1 may transmit one or more pack isolation signals to TPIM power inverter 162, which in turn methodically opens the set 164 of semiconductor switches $S_{11}$-$S_{16}$ of FIG. 2, whereby the traction battery packs 121A, 121B electrically disconnect from the traction motor 114. After isolating the traction battery packs at process block 211, the method 200 continues to decision block 213 to evaluate a measured, real-time bus current of a DC bus, such as high-voltage DC bus bar 160 of FIG. 2, to determine if the measured bus current is less than a system-calibrated bus current threshold. This bus current threshold may be a relatively small value, on the order of about 5.0 amps (A) or less, for example. Normally, the DC bus current will rapidly reduce to zero (0) A in less than one (1) millisecond (ms) after the inverter switches are opened. If the measured bus current has not yet reduced to below the bus current threshold (block 213=NO), the RESS 115 may run in a continuous loop to measure bus current until it falls below this threshold.

After confirming that the DC bus current has fallen below the bus current threshold (block 213=YES), process block 215 of method 200 provides memory-stored processor-executable instructions for a vehicle controller to command open one or more of the pack contactor switches S1-S3 depending on whether the V-switch is a high-to-low or a low-to-high voltage switching operation. While operating the automobile 10 of FIG. 1, the vehicle operator may desire to reduce vehicle speed and, thus, motor torque demand. A reduction in motor torque demand leads to reduced vehicle battery system loading; vehicle battery system (RESS) 115 responsively cuts battery system output voltage (e.g., from 800V to 400V). In this case, the vehicle controller 23 transmits a switch open signal to open the third pack contactor switch S3 at process block 215. On the other hand, the vehicle operator may desire to increase vehicle speed with a concomitant increase in motor torque demand and, at the same time, battery system load. Consequently, vehicle battery system (RESS) 115 responsively boosts battery system output voltage (e.g., from 400V to 800V). In this case, the vehicle controller 23 transmits a switch open signal to open the first and second pack contactor switch S1, S2 at process block 215.

With continuing reference to FIG. 3, the method 200 proceeds to decision block 217 to ascertain whether or not a measured, real-time pack current of each and every traction battery pack is less than or equal to a pack-calibrated current threshold (e.g., zero (0) amps). Vehicle controller 23 of FIG. 1 may prompt current sensors 174A and 174B of FIG. 2 to monitor the electrical current outputs of the traction battery packs 121A, 121B. If any of the measured battery pack currents are not equal to the pack current threshold (block 217=NO), the RESS 115 may run in a continuous loop to repeatedly measure and compare pack currents until it is confirmed that all pack currents are at or below this threshold (e.g., have reached zero amps). Once the RESS 115 is able to confirm that the battery pack currents are zero (block 217=YES), method 200 move to process block 219 with transmitting a (first) pulse-width modulation (PWM) signal to modulate respective pulse widths of the pack contactor switches that were not opened at process block 215. Since all three pack contactor switches S1-S3 are power switches, the RESS 115 may adjust the individual pulse widths of each switch being closed (e.g., between about 5% to 95%) to control an average charge or discharge current to be less than a pack current limit to charge and discharge a capacitor 172.

Prior to, contemporaneous with, or after using PWM control to control the pack contactor switches that will be closed, the method 200 continues to decision block 221 to evaluate a measured, real-time capacitor voltage of a bus capacitor, such as DC bus capacitor 172 of FIG. 2, to determine if the measured capacitor voltage is less than or greater than a pack-calibrated capacitor voltage threshold. This capacitor voltage threshold may be set as a capacitor-specific voltage value at which the bus capacitor voltage is close to a battery voltage (e.g., 800V upon switching from 400V to 800V). For a high-to-low V-switch operation, the RESS 115 may determine if the measured capacitor voltage is less than the capacitor voltage threshold. Contrarywise, the RESS 115 may determine if the measured capacitor voltage is greater than the capacitor voltage threshold for a low-to-high V-switch operation. A negative determination from the evaluation of measured, real-time capacitor voltage (block 221=NO) causes the method 200 to loop back to process block 219 and continue to modulate the pulse widths of the to-be-closed pack contactor switches.

After confirming that the measured capacitor voltage is less than (or greater than) the capacitor voltage threshold during a high-to-low (or low-to-high) V-switch operation (block 221=YES), process block 223 of method 200 provides memory-stored processor-executable instructions for a vehicle controller to command closed one or more of the pack contactor switches S1-S3 depending on whether the V-switch is a high-to-low or a low-to-high voltage switching operation. To battery system output voltage (e.g., from 800V to 400V), the vehicle controller 23 transmits a switch closed signal to close the first and second pack contactor switch S1, S2 at process block 223. On the other hand, the vehicle controller 23 transmits a switch closed signal to close the third pack contactor switch S3 at process block 223 in order to boost battery system output voltage (e.g., from 400V to 800V). At process block 225, the method 200 enables inverter PWM control. For instance, a (second) PWM signal is transmitted to the power inverter 162 of FIG. 2 to modulate the respective pulse widths of the inverter switches $S_{11}$-$S_{16}$ to invert the total DC voltage output by the two traction battery packs 121A, 121B into a desired AC voltage transmitted to the traction motor 114 to achieve a requested torque output. Method 200 may thereafter proceed to terminal block 209 and terminate or loop back to terminal block 201 and repeat the above-described operations.

Aspects of this disclosure may be implemented, in some embodiments, through a computer-executable program of instructions, such as program modules, generally referred to as software applications or application programs executed by any of a controller or the controller variations described herein. Software may include, in non-limiting examples, routines, programs, objects, components, and data structures that perform particular tasks or implement particular data types. The software may form an interface to allow a computer to react according to a source of input. The software may also cooperate with other code segments to initiate a variety of tasks in response to data received in conjunction with the source of the received data. The software may be stored on any of a variety of memory media, such as CD-ROM, magnetic disk, bubble memory, and semiconductor memory (e.g., various types of RAM or ROM).

Moreover, aspects of the present disclosure may be practiced with a variety of computer-system and computer-network configurations, including multiprocessor systems, microprocessor-based or programmable-consumer electronics, minicomputers, mainframe computers, and the like. In addition, aspects of the present disclosure may be practiced in distributed-computing environments where tasks are performed by resident and remote-processing devices that are linked through a communications network. In a distributed-computing environment, program modules may be located in both local and remote computer-storage media including memory storage devices. Aspects of the present disclosure may therefore be implemented in connection with various hardware, software or a combination thereof, in a computer system or other processing system.

Any of the methods described herein may include machine readable instructions for execution by: (a) a processor, (b) a controller, and/or (c) any other suitable processing device. Any algorithm, software, control logic, protocol or method disclosed herein may be embodied as software stored on a tangible medium such as, for example, a flash memory, a CD-ROM, a floppy disk, a hard drive, a digital versatile disk (DVD), or other memory devices. The entire algorithm, control logic, protocol, or method, and/or parts thereof, may alternatively be executed by a device other than a controller and/or embodied in firmware or dedicated hardware in an available manner (e.g., implemented by an application specific integrated circuit (ASIC), a programmable logic device (PLD), a field programmable logic device (FPLD), discrete logic, etc.). Further, although specific algorithms are described with reference to flowcharts depicted herein, many other methods for implementing the example machine-readable instructions may alternatively be used.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A method of controlling operation of a motor vehicle, the motor vehicle including multiple wheels, an electric machine operable to drive at least one of the wheels to thereby propel the motor vehicle, first and second traction battery packs operable to power the electric machine, and a vehicle controller controlling the electric machine and battery packs, the method comprising:

receiving, via the vehicle controller, a voltage switch signal to change a battery system output voltage from a first voltage to a second voltage;

determining, via the vehicle controller, if a machine speed of the electric machine is less than a calibrated base machine speed;

transmitting, via the vehicle controller to a power inverter responsive to the machine speed being less than the calibrated base machine speed, a pack isolation signal to open multiple inverter switches thereby electrically disconnecting the first and second traction battery packs from the electric machine;

determining, via the vehicle controller, if a bus current of a direct current (DC) bus electrically connecting the first and second traction battery packs to the power inverter is less than a calibrated bus current threshold; and transmitting, via the vehicle controller to a set of pack contactor switches responsive to the bus current being less than the calibrated bus current threshold, an open signal to open one of the pack contactor switches and a close signal to close another of the pack contactor switches thereby causing the first and/or second traction battery packs to output the second voltage.

2. The method of claim 1, wherein the set of pack contactor switches includes first, second, and third switches, and wherein closing the first and second switches while opening the third switch electrically connects the first and second traction battery packs in parallel, and closing the third switch while opening the first and second switches electrically connects the first and second traction battery packs in series.

3. The method of claim 2, wherein the first voltage is greater than the second voltage, the open signal opens the third switch, and the close signal closes the first and second switches.

4. The method of claim 3, further comprising:
determining, via the vehicle controller prior to closing the first and second switches, if a capacitor voltage of a bus capacitor of the DC bus is less than a calibrated capacitor voltage threshold,
wherein transmitting the close signal to the set of pack contactor switches to close the first and second switches is responsive to the capacitor voltage being less than the calibrated capacitor voltage threshold.

5. The method of claim 4, further comprising:
determining, via the vehicle controller prior to closing the first and second switches, if first and second battery pack currents of the first and second traction battery packs, respectively, are both less than or equal to a calibrated pack current threshold; and
transmitting, via the vehicle controller to the set of pack contactor switches responsive to the first and second battery pack currents being less than or equal to the calibrated pack current threshold, a first pulse-width modulation (PWM) signal to modulate first and second pulse widths of the first and second switches, respectively.

6. The method of claim 5, further comprising transmitting, via the vehicle controller to the power inverter after closing the first and second switches, a second PWM signal to modulate pulse widths of the inverter switches to thereby invert a DC voltage output by the first and/or second traction battery packs into an alternating current (AC) voltage received via the electric machine.

7. The method of claim 3, further comprising:
measuring, via first and second current sensors, first and second charge currents of the first and second traction battery packs, respectively;

determining, via the vehicle controller after opening the third switch and closing the first and second switches, if the first and second charge currents are both less than a calibrated charge current threshold; and
balancing a bus voltage of the DC bus by discharging a bus capacitor of the DC bus into the first and second traction battery packs.

8. The method of claim 3, further comprising:
transmitting, via the vehicle controller to the set of pack contactor switches after opening the third switch, a second open signal to open the first and second switches;
determining if first and second currents of the first and second traction battery packs, respectively, are approximately equal to zero;
storing, via the vehicle controller in a memory device responsive to the first and second currents being approximately equal to zero, a switch state indicator indicative of the third switch being in an open state; and
transmitting a second close signal to close the first and second switches.

9. The method of claim 2, wherein the first voltage is less than the second voltage, the open signal opens the first and second switches, and the close signal closes the third switch.

10. The method of claim 9, further comprising:
determining, via the vehicle controller prior to closing the third switch, if a capacitor voltage of a bus capacitor of the DC bus is greater than a calibrated capacitor voltage threshold,
wherein transmitting the close signal to the set of pack contactor switches to close the third switch is responsive to the capacitor voltage being greater than the calibrated voltage threshold.

11. The method of claim 10, further comprising:
determining, via the vehicle controller prior to closing the third switch, if first and second battery pack currents of the first and second traction battery packs, respectively, are both less than or equal to a calibrated pack current threshold; and
transmitting, via the vehicle controller to the set of pack contactor switches responsive to the first and second battery pack currents being less than or equal to the calibrated pack current threshold, a first pulse-width modulation (PWM) signal to modulate a third pulse width of the third switch.

12. The method of claim 11, further comprising transmitting, via the vehicle controller to the power inverter after closing the third switch, a second PWM signal to modulate pulse widths of the inverter switches to thereby invert a DC voltage output by the first and/or second traction battery packs into an alternative current (AC) voltage received via the electric machine.

13. The method of claim 9, further comprising:
measuring, via first and second current sensors, first and second charge currents of the first and second traction battery packs, respectively;
determining, via the vehicle controller after opening the first and second switches and closing the third switch, if the first and second charge currents are both less than a calibrated charge current threshold; and
balancing a bus voltage of the DC bus by charging a bus capacitor of the DC bus from the first and second traction battery packs.

14. The method of claim 9, further comprising:
transmitting, via the vehicle controller to the set of pack contactor switches after opening the first and second switches, a second open signal to open the third switch;

determining if first and second currents of the first and second traction battery packs, respectively, are approximately equal to zero;

storing, via the vehicle controller in a memory device responsive to the first and second currents being approximately equal to zero, a switch state indicator indicative of the first and second switches being in an open state; and transmitting a second close signal to close the third switch.

15. An electric-drive motor vehicle comprising:

a vehicle body with multiple road wheels attached to the vehicle body;

a traction motor attached to the vehicle body and operable to drive one or more of the road wheels to thereby propel the motor vehicle;

a battery system with first and second traction battery packs attached to the vehicle body and operable to power the traction motor; and a vehicle controller communicatively connected to the traction motor and the traction battery packs, the vehicle controller being programmed to:

receive a voltage switch signal to change a battery system output voltage of the battery system from a first voltage to a second voltage;

determine if a machine speed of the traction motor is less than a calibrated base machine speed;

responsive to the machine speed being less than the calibrated base machine speed, transmit a pack isolation signal to a power inverter to open multiple inverter switches thereby electrically disconnecting the first and second traction battery packs from the traction motor;

determine if a bus current of a direct current (DC) bus electrically connecting the first and second traction battery packs to the power inverter is less than a calibrated bus current threshold; and responsive to the bus current being less than the calibrated bus current threshold, transmit to a set of pack contactor switches an open signal to open one of the pack contactor switches and a close signal to close another of the pack contactor switches thereby causing the first and/or second traction battery packs to output the second voltage.

16. The electric-drive motor vehicle of claim 15, wherein the set of pack contactor switches includes first, second, and third switches, and wherein closing the first and second switches while opening the third switch electrically connects the first and second traction battery packs in parallel, and closing the third switch while opening the first and second switches electrically connects the first and second traction battery packs in series.

17. The electric-drive motor vehicle of claim 16, wherein:

the first voltage is greater than the second voltage, the open signal opens the third switch, and the close signal closes the first and second switches; or the first voltage is less than the second voltage, the open signal opens the first and second switches, and the close signal closes the third switch.

18. The electric-drive motor vehicle of claim 17, wherein the vehicle controller is further programmed to:

determine, prior to transmitting the close signal, whether a capacitor voltage of a bus capacitor of the DC bus is less than or greater than a calibrated capacitor voltage threshold, wherein transmitting the close signal to close the first and second switches is responsive to the capacitor voltage being less than the calibrated capacitor voltage threshold, and wherein transmitting the close signal to close the third switch is responsive to the capacitor voltage being greater than the calibrated capacitor voltage threshold.

19. The electric-drive motor vehicle of claim 18, wherein the vehicle controller is further programmed to:

determine, prior to transmitting the close signal, if first and second battery pack currents of the first and second traction battery packs, respectively, are both less than or equal to a calibrated pack current threshold; and transmit, to the set of pack contactor switches responsive to the first and second battery pack currents being less than or equal to the calibrated pack current threshold, a first pulse-width modulation (PWM) signal to modulate a respective pulse width of one or more of the switches.

20. The electric-drive motor vehicle of claim 19, wherein the vehicle controller is further programmed to transmit, to the power inverter after transmitting the close signal, a second PWM signal to modulate pulse widths of the inverter switches to thereby invert a DC voltage output by the first and/or second traction battery packs into an alternating current (AC) voltage received via the traction motor.

* * * * *